(12) United States Patent
Leng et al.

(10) Patent No.: US 8,545,999 B1
(45) Date of Patent: Oct. 1, 2013

(54) METHOD AND SYSTEM FOR PROVIDING A MAGNETORESISTIVE STRUCTURE

(75) Inventors: Qunwen Leng, Palo Alto, CA (US);
Mahendra Pakala, Fremont, CA (US);
Yong Shen, Saratoga, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 438 days.

(21) Appl. No.: 12/035,036

(22) Filed: Feb. 21, 2008

(51) Int. Cl.
*G11B 5/39* (2006.01)
*H01F 10/08* (2006.01)
*H01L 43/12* (2006.01)

(52) U.S. Cl.
USPC .......... 428/811.5; 428/811.1; 428/812; 360/324.11; 360/324.12; 360/324.2

(58) Field of Classification Search
None
See application file for complete search history.

(56) References Cited

U.S. PATENT DOCUMENTS

| | | | |
|---|---|---|---|
| 5,764,445 A | 6/1998 | Torng et al. |
| 6,322,640 B1 | 11/2001 | Xiao et al. |
| 6,330,542 B1 | 12/2001 | Sevcik et al. |
| 6,347,049 B1 | 2/2002 | Childress et al. |
| 6,413,325 B1 | 7/2002 | Shimazawa et al. |
| 6,535,294 B1 | 3/2003 | Arledge, Jr. et al. |
| 6,680,831 B2 | 1/2004 | Hiramoto et al. |
| 6,690,163 B1 | 2/2004 | Hoshiya et al. |
| 6,717,686 B1 | 4/2004 | Farros et al. |
| 6,724,581 B2 | 4/2004 | Westwood |
| 6,751,073 B2 | 6/2004 | Hasegawa |
| 6,791,792 B2 | 9/2004 | Takahashi |
| 6,819,532 B2 | 11/2004 | Kamijo |
| 6,841,395 B2 | 1/2005 | Linn et al. |
| 6,848,169 B2 | 2/2005 | Shin et al. |
| 6,876,507 B2 | 4/2005 | Chen et al. |
| 6,937,434 B2 | 8/2005 | Takahashi |
| 7,077,929 B2 | 7/2006 | You et al. |
| 7,149,709 B1 | 12/2006 | Lopez, Jr. |
| 7,160,572 B2 * | 1/2007 | Fujikata et al. ............ 427/127 |
| 7,211,340 B2 | 5/2007 | Nolan |
| 7,230,264 B2 | 6/2007 | Thean et al. |
| 7,230,265 B2 | 6/2007 | Kaiser et al. |
| 7,241,631 B2 | 7/2007 | Huai et al. |
| 7,256,971 B2 | 8/2007 | Horng et al. |
| 7,270,896 B2 | 9/2007 | Parkin |
| 7,349,187 B2 | 3/2008 | Parkin |
| 7,351,483 B2 | 4/2008 | Parkin |
| 7,423,849 B2 | 9/2008 | Gill |
| 7,443,639 B2 | 10/2008 | Parkin |
| 7,488,609 B1 | 2/2009 | Lin et al. |
| 7,495,796 B2 | 2/2009 | Keane et al. |

(Continued)

OTHER PUBLICATIONS

Djayaprawira, et al., "230% room-temperature magnetoresistance in CoFeB/MgO/CoFeB magnetic tunnel junctions", Applied Physics Letters 86, 092502, 3 pages, 2005.

(Continued)

*Primary Examiner* — Kevin Bernatz (57) ABSTRACT

A method and system for providing a magnetoresistive structure are described. The magnetoresistive structure includes a first electrode, an insertion layer, a crystalline tunneling barrier layer, and a second electrode. The first electrode includes at least a first magnetic material and boron. The crystalline tunneling barrier layer includes at least one constituent. The insertion layer has a first boron affinity. The at least one constituent of the crystalline tunneling barrier layer has at least a second boron affinity that is less than the first boron affinity. The second electrode includes at least a second magnetic material.

24 Claims, 5 Drawing Sheets

(56) References Cited

U.S. PATENT DOCUMENTS

| | | | |
|---|---|---|---|
| 7,695,761 B1* | 4/2010 | Shen et al. | 427/127 |
| 7,751,156 B2 | 7/2010 | Mauri et al. | |
| 7,760,474 B1 | 7/2010 | Huai et al. | |
| 7,800,868 B2 | 9/2010 | Gao et al. | |
| 7,916,433 B2* | 3/2011 | Huai et al. | 360/324.12 |
| 7,929,259 B2 | 4/2011 | Gao et al. | |
| 8,059,374 B2* | 11/2011 | Zhao et al. | 360/324.2 |
| 8,194,365 B1 | 6/2012 | Leng et al. | |
| 2002/0009616 A1* | 1/2002 | Kamiguchi et al. | 428/692 |
| 2003/0179071 A1 | 9/2003 | Hiramoto et al. | |
| 2004/0056288 A1 | 3/2004 | Fukuzumi | |
| 2004/0091744 A1 | 5/2004 | Carey et al. | |
| 2004/0219772 A1 | 11/2004 | You et al. | |
| 2005/0009211 A1 | 1/2005 | Linn et al. | |
| 2005/0120544 A1 | 6/2005 | Lam | |
| 2005/0195534 A1 | 9/2005 | Gill | |
| 2006/0071287 A1 | 4/2006 | Yuasa et al. | |
| 2006/0093862 A1 | 5/2006 | Parkin | |
| 2006/0102969 A1 | 5/2006 | Huai et al. | |
| 2006/0128038 A1* | 6/2006 | Pakala et al. | 438/4 |
| 2006/0141640 A1* | 6/2006 | Huai et al. | 438/3 |
| 2006/0180839 A1 | 8/2006 | Fukumoto et al. | |
| 2006/0209590 A1 | 9/2006 | Guo et al. | |
| 2007/0074317 A1 | 3/2007 | Pakala et al. | |
| 2007/0111332 A1 | 5/2007 | Zhao et al. | |
| 2007/0139827 A1 | 6/2007 | Gao et al. | |
| 2007/0188945 A1 | 8/2007 | Fuji et al. | |
| 2007/0228501 A1 | 10/2007 | Nakamura et al. | |
| 2007/0243639 A1 | 10/2007 | Pietambaram et al. | |
| 2008/0030907 A1 | 2/2008 | Nakabayashi et al. | |
| 2008/0062581 A1* | 3/2008 | Parkin | 360/324.11 |
| 2008/0080101 A1 | 4/2008 | Mauri et al. | |
| 2008/0124454 A1 | 5/2008 | Djayaprawira et al. | |
| 2008/0174921 A1* | 7/2008 | Ikarashi et al. | 360/320 |
| 2008/0179699 A1 | 7/2008 | Horng et al. | |
| 2008/0299679 A1 | 12/2008 | Zhao et al. | |
| 2009/0027810 A1* | 1/2009 | Horng et al. | 360/324.2 |
| 2009/0027813 A1* | 1/2009 | Carey et al. | 360/324.12 |
| 2010/0073827 A1* | 3/2010 | Zhao et al. | 360/324.2 |
| 2010/0255349 A1* | 10/2010 | Gao et al. | 428/811.1 |

OTHER PUBLICATIONS

Tsunekawa, et al., "Huge Magnetoresistance and Low Junction Resistance in Magnetic Tunnel Junctions with Crystalline MgO Barrier", IEEE Transactions on Magnetics, vol. 42, No. 2, pp. 103-107, Feb. 2006.

Park, et al., "Annealing effects on structural and transport properties of rf-sputtered CoFeB/MgO/CoFeB magnetic tunnel junctions", Journal of Applied Physics 99, 08A901, 3 pages, 2006.

Park, et al., "Effect of Adjacent Layers on Crystallization and Magnetoresistance in CoFeB/MgO/CoFeB Magnetic Tunnel Junction", IEEE Transactions on Magnetics, vol. 42, No. 10, pp. 2639-2641, Oct. 2006.

Tsunekawa, et al., "Giant tunneling magnetoresistance effect in low-resistance CoFeB/MgO(001)/CoFeB magnetic tunnel junctions for read-head applications", Applied Physics Letters 87, 072503, 3 pages, 2005.

Read, et al., "X-ray photoemission study of CoFeB/MgO thin film bilayers", Applied Physics Letters 90, 132503, 3 pages, 2007.

Neil Smith, "Fluctuation-dissipation considerations for phenomenological damping models for ferromagnetic thin film," Journal of Applied Physics, Oct. 1, 2002, vol. 92, No. 7, pp. 3877-3885.

Jian-Gang Zhu, "Magnetization Dynamics: Thermal Driven Noise in Magnetoresistive Sensors," Handbook of Magnetism and Advanced Magnetic Material, John Wiley & Sons, Ltd., 2007, 16 pages.

S.W. Sun, et al., "Possible giant surface magnetostriction in amorphous Co76Cr4B20", J. Appl. Phys. 69 (Abstract), Apr. 15, 1991, 5218.

Burton, et al., "Atomic and Electronic Structure of the CoFeB/MgO Interface from First Principles", Applied Physics Letters 89, 142507, 4 pages, 2006.

\* cited by examiner

METHOD AND SYSTEM FOR PROVIDING A MAGNETORESISTIVE STRUCTURE

BACKGROUND

Figure 1:
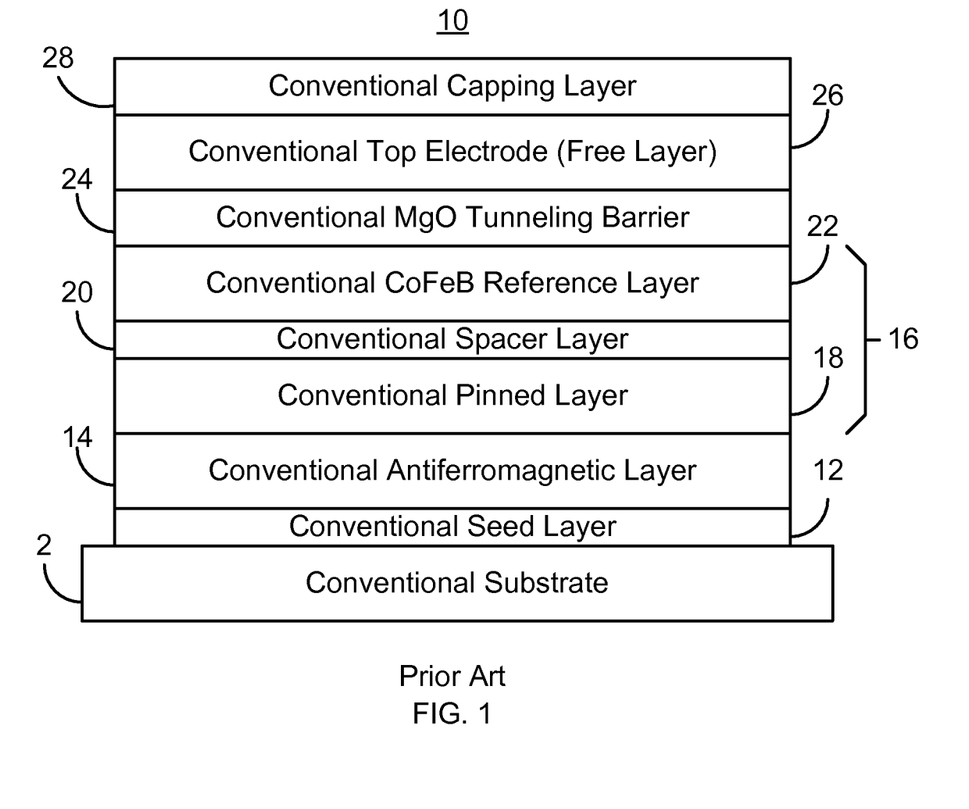
FIG. 1 is a diagram depicting a conventional tunneling magnetoresistive element.

FIG. 1 depicts a conventional tunneling magnetoresistive (TMR) element 10 having a crystalline MgO tunneling barrier 24. For simplicity, FIG. 1 is not drawn to scale. In addition, although not shown in FIG. 1, the crystalline MgO tunneling barrier 24 could include a thin Mg or Pt layer between the bottom electrode 16 and the MgO in the tunneling barrier 24. The conventional TMR element 10 resides on a substrate 2 on which seed layer(s) 12 have been formed. The conventional TMR element 10 includes a conventional bottom electrode, or pinned layer 16. The conventional bottom electrode 16 shown is a synthetic antiferromagnet that includes magnetic layers 18 and 22 separated by a thin nonmagnetic, conductive spacer layer 20 that might include Ru. The magnetizations (not shown) of the pinned layer 18 and the reference layer 22 are substantially fixed, or pinned. The conventional TMR element 10 also includes a conventional free layer 26, or top electrode 26. The conventional top electrode 26 typically has a magnetization (not shown) that may move, or switch. The conventional reference layer 22, pinned layer 20, and top electrode 26 are typically CoFeB layers. The conventional TMR element 10 may also include a conventional pinning layer 14, such as an antiferromagnetic (AFM) layer 14, that is used to fix the magnetization of the bottom electrode 16. Thus magnetization of the conventional pinned layer 16 is fixed, or pinned, in a particular direction, typically by an exchange-bias interaction with the AFM layer 14. However, the magnetization 21 of the free layer 20 may move, or switch, in response to an external field. Also shown is a conventional capping layer 28, which may be formed of materials such as Ta.

The conventional TMR element 10 is desired to have certain properties, which use of the crystalline MgO tunneling barrier 24 and CoFeB electrodes 16 and 26 may enable. The conventional top electrode 26 is desired to be soft, having a coercivity of not more than five Oersted. A low magnetostriction of $\lambda_s$ of not more than approximately $1.0 \times 10^{-6}$ (or not less than approximately $-1.0 \times 10^{-6}$) is also desired. In addition, a low interlayer exchange coupling, $H_{in}$ of not more than fifty Oersted is desired to help ensure that the magnetization of the conventional top electrode 26 is free to respond to an external field. Thus, CoFeB may be used for the reference layer 22 and the top electrode 26. It is also noted that the top surface of the reference layer 22 is desired to be smooth to improve growth of the MgO tunneling barrier 24. The amorphous structure of CoFeB aids in producing such a surface for the reference layer 22. The conventional MgO tunneling barrier 24 may aid in providing other desired properties for the conventional TMR element 10 if the MgO has the desired crystallographic structure. For example, the MgO should have a near perfect [100] texture and a large grain size. As used herein, a specific texture indicates that the layer has a dominant orientation. Thus, the conventional barrier layer 24 of MgO having a [100] texture means that the conventional MgO barrier layer 24 has a dominant [100] orientation. Use of such a conventional MgO barrier layer 24 may result in a low Ra of not more than 3 $\Omega/\mu m^2$ or a high Q-factor (($\Delta R/R$)/Ra high) for the conventional TMR element 10. In order to obtain such properties for the conventional TMR element 10, therefore, the crystalline MgO tunneling barrier 24 and CoFeB electrodes 16 and 26 may be used.

Although the conventional TMR element 10 may have the desired properties, issues with the conventional MgO tunneling barrier 24 may adversely affect the properties of the conventional TMR element 10. The conventional MgO tunneling barrier 24 should be substantially impurity-free and have the desired crystallographic structure for the above-identified properties. However, during fabrication of devices including the conventional TMR element 10, elevated temperature anneals may be performed after the conventional MgO tunneling barrier 24 is formed. As a result, boron may diffuse from one or more of the electrodes 16 and 26 to the MgO tunneling barrier layer 24. A conventional TMR device in which boron has diffused into the MgO tunneling barrier is subject to a low Q-factor at low Ra. Consequently, performance of the conventional TMR element 10 is adversely affected.

Accordingly, what is needed is a system and method for improving the performance of TMR elements utilizing MgO tunneling barrier layers.

BRIEF SUMMARY OF THE INVENTION

A method and system for providing a magnetoresistive structure are described. The magnetoresistive structure includes a first electrode, an insertion layer, a crystalline tunneling barrier layer, and a second electrode. The first electrode includes at least a first magnetic material and boron. The crystalline tunneling barrier layer includes at least one constituent. The insertion layer has a first boron affinity. The at least one constituent of the crystalline tunneling barrier layer has at least a second boron affinity that is less than the first boron affinity. The second electrode includes at least a second magnetic material.

DETAILED DESCRIPTION OF THE PREFERRED EMBODIMENTS

Figure 2:
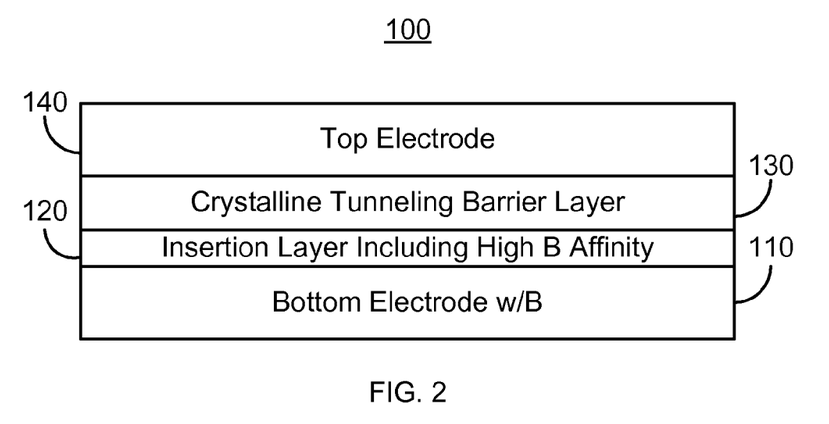
FIG. 2 depicts an exemplary embodiment of a magnetic structure.

FIG. 2 depicts an exemplary embodiment of a magnetic structure 100. The magnetic structure 100 is a tunneling magnetoresistive (TMR) element. For clarity, the magnetic structure 100 is described in the context of a single TMR element. However, in another embodiment, a dual TMR element (not shown) or other analogous structure might be used. For simplicity, FIG. 2 is not drawn to scale.

The magnetic structure 100 includes a bottom electrode 110, an insertion layer 120, a crystalline tunneling barrier 130, and a top electrode 140. In one embodiment, the bottom electrode 110 is a pinned or reference layer, while the top electrode 140 is a free layer. In another embodiment, the bottom electrode 110 may be a free layer while the top electrode 140 is a pinned, or reference layer. The magnetic structure 100 is described in the context of the bottom electrode 110 being a pinned or reference layer and the top electrode 140 being a free layer.

The bottom electrode 110 is a pinned/reference layer that includes one or more magnetic materials and boron. Thus, in one embodiment, a pinning layer (not shown) such as an AFM layer may be included in the magnetic structure 100. In one embodiment, the bottom electrode 110 includes CoFeB. In one embodiment, the bottom electrode 110 is a synthetic antiferromagnet including at least two magnetic layers separated by a thin, nonmagnetic conductive layer. In such an embodiment, at least the layer closest to the insertion layer 120 includes CoFeB. However, in another embodiment, the bottom electrode 110 could be a simple, single layer.

The top electrode 140 is a free layer. Thus, the top electrode 140 is magnetic. In one embodiment, the top electrode 140 is a synthetic antiferromagnet. However, in another embodiment, the top electrode 140 is simple, including one layer. In one embodiment, the top electrode 140 includes CoFeB. In one embodiment, the top electrode 140 is to be soft, having a coercivity of not more than five Oersted. In one embodiment, the magnetic structure 100 has a low magnetostriction of $\lambda_s$ of not more than approximately $1.0 \times 10^{-6}$ (or not less than approximately $-1.0 \times 10^{-6}$). In addition, in one embodiment, the magnetic structure 100 has a low interlayer exchange coupling, $H_{in}$, of not more than fifty Oersted.

The crystalline tunneling barrier 130 includes one or more constituents. The constituent(s) have a particular boron affinity. In one embodiment, the crystalline tunneling barrier layer 130 includes MgO having a desired crystal structure. For example, the MgO may have a near perfect [100] texture and a large grain size. In one embodiment, the crystalline tunneling barrier 130 includes a layer of MgO having the desired texture and grain size described above. In another embodiment, the crystalline tunneling barrier 130 may include a thin Mg layer adjacent to the insertion layer 120 and a layer of crystalline MgO having the desired texture and grain size. In another embodiment, the crystalline tunneling barrier 130 may include a layer of crystalline MgO having the desired texture and grain size that is sandwiched between thin Mg layers adjacent to the insertion layer 120 and the top electrode 140.

The insertion layer 120 resides between the bottom electrode 110 and the crystalline tunneling barrier 130. The insertion layer 120 may be magnetic. The insertion layer 120 has a boron affinity. The boron affinity of the insertion layer 120 is greater than the boron affinity of the constituent(s) of the crystalline tunneling barrier layer 130. In one embodiment, the insertion layer includes at least one of Co and Fe. In some embodiments, the insertion layer may include Co, Fe, a binary alloy including Co and/or Fe, or a ternary alloy including at least one of Co and Fe. For example, the insertion layer 120 may include Co, Fe, $Co_xFe_{1-x}$, where x is at least zero and not more than one, CoFeTa, or CoFeZr. In such embodiments, the insertion layer has a higher boron affinity than the Mg in the crystalline tunneling barrier layer 130. The insertion layer 120 may also be thin. For example, the insertion layer 130 may have a thickness of at least two Angstroms and not more than fifteen Angstroms. In another embodiment, the insertion layer 120 may have a thickness of at least three Angstroms and not more than seven Angstroms.

The insertion layer 120 has a higher boron affinity than the constituent, such as Mg, of the crystalline tunneling barrier 130. Consequently, boron in the bottom electrode 110 may be significantly less likely to diffuse through the insertion layer 120 into the crystalline tunneling barrier 130. Thus, the insertion layer 120 may function as a boron barrier layer between the bottom electrode 110 and the crystalline tunneling barrier layer 130. The insertion layer 120 may provide a barrier to boron diffusion even at elevated temperature anneals. For example, boron diffusion into the crystalline tunneling barrier 130 may be prevented even at anneals of temperatures of at least one hundred and not more than four hundred degrees centigrade. In one embodiment, the insertion layer 120 may prevent diffusion of boron into the crystalline tunneling barrier 130 at anneals of at least two hundred and not more than three hundred and sixty degrees centigrade. Furthermore, a thin insertion layer 120 may not substantially change the surface roughness of the bottom electrode 110. Consequently, the crystalline tunneling barrier layer 130 may still be grown on a smooth surface. Thus, the desired orientation and large grain size may be achieved for the crystalline tunneling barrier layer 130. The insertion layer 120 being magnetic may allow it to be considered part of the bottom electrode 110 for tunneling magnetoresistance. Further, the use of an insertion layer 120 including at least one of Co and Fe provides the desired spin polarization of current carriers at the interface of the crystalline tunneling barrier layer 130 and the bottom electrode 110. Thus, through the use of the insertion layer 120, the desired Ra and Q for the magnetic structure 100 may be achieved.

Figure 3:
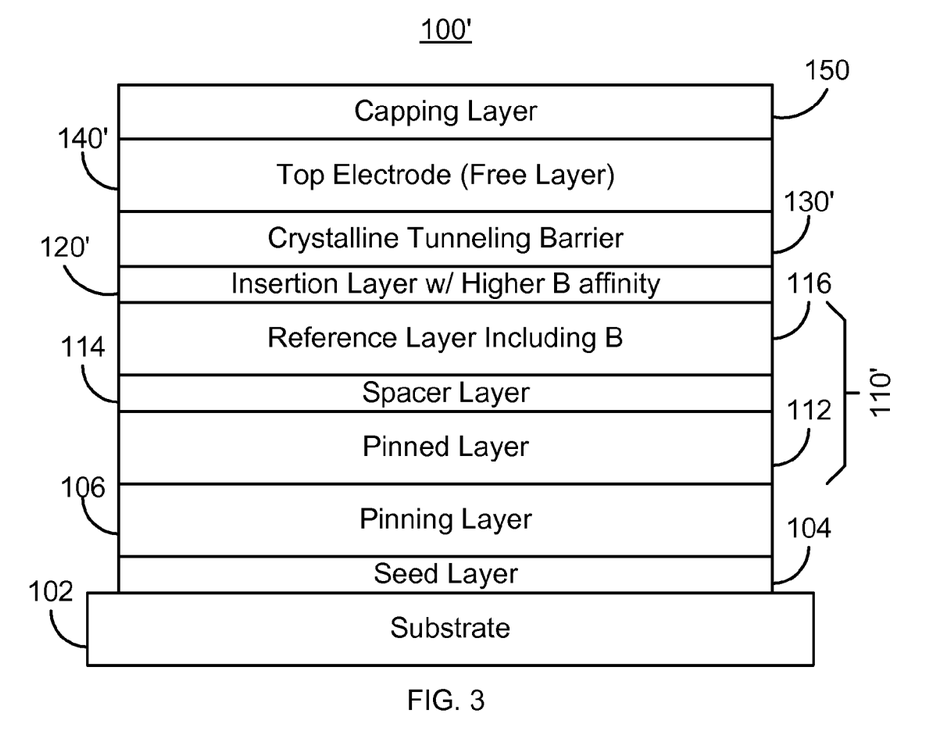
FIG. 3 depicts another exemplary embodiment of a magnetic structure.

FIG. 3 depicts another exemplary embodiment of a magnetic structure 100'. For clarity, the magnetic structure 100' is described in the context of a single TMR element. However, in another embodiment, a dual TMR element (not shown) or other analogous structure might be used. For simplicity, FIG. 3 is not drawn to scale. The magnetic structure 100' is analogous to the magnetic structure 100 depicted in FIG. 2. Consequently, analogous components are labeled similarly. The magnetic structure 100' thus includes a bottom electrode 110', an insertion layer 120', a crystalline tunneling barrier 130, and a top electrode 140'. In addition, the magnetic structure 100' includes a pinning layer 106 formed on seed layer(s) 104 as well as a capping layer 150. The seed layer(s) 104 are formed on a substrate 102. The magnetic structure 100 is provided on seed layer(s) 104 that are provided on a substrate 102. The substrate 102 may be an underlying substrate, such as a silicon wafer, or other structure on which the magnetic structure 100' is fabricated. The bottom electrode 110' may be a pinned or reference layer and the top electrode 140' a free layer, or vice versa. In the embodiment shown, the top electrode 140' is the free layer. If the bottom electrode 110' were the free layer, then the pinning layer 106 would reside above the top electrode 140'.

In the embodiment shown, the bottom electrode 110' is a synthetic antiferromagnet including magnetic layers 112 and 116 separated by a spacer layer 114. However, in another embodiment, the bottom electrode 110' may include additional layers. The pinned layer 112 magnetization (not shown) is substantially fixed, or pinned, by the pinning layer 106. The magnetizations of the pinned layer and reference layer 116 are coupled. Consequently, the magnetization (not shown) of the reference layer 116 is also substantially fixed. The reference layer 116 includes at least one magnetic material and boron. In one embodiment, the reference layer 116 is a CoFeB layer. Such a layer may have an amorphous crystal structure, thereby providing a smoother surface for growth of the crystalline tunneling barrier 130'. The pinned layer 112 also includes one or more magnetic materials. In one embodiment, the pinned layer 112 is also formed of CoFeB. In one embodiment, the pinned layer 112 and reference layer 116 may include different materials. For example, in one embodiment, the pinned layer 112 includes CoFeB, the spacer layer 114 includes Ru, and the reference layer 116 includes CoFe.

In another embodiment, the pinned layer 112 includes two layers of CoFe separated by a layer of Ru, the spacer layer 114 includes Ta, and the reference layer 116 includes CoFeB.

The pinning layer 106 pins the magnetization of the pinned layer 112 in place. In one embodiment, the pinning layer 106 is an AFM layer. However, in another embodiment, the pinning layer 106 may be some other type of material, such as a hard magnet.

The top electrode 140' is a free layer and is, therefore, magnetic. In one embodiment, the top electrode 140' is a synthetic antiferromagnet. However, in another embodiment, the top electrode 140' is simple. The top electrode 140' is analogous to the top electrode 140 and thus has similar properties. In one embodiment, the magnetic structure 100' has a low magnetostriction of $\lambda_s$ of not more than approximately $1.0 \times 10^{-6}$ (or not less than approximately $-1.0 \times 10^{-6}$). The magnetic structure 100' may also have a low interlayer exchange coupling, $H_{in}$ of not more than fifty Oersted.

The crystalline tunneling barrier 130' includes one or more constituents and is analogous to the crystalline tunneling barrier 130. Thus, the crystalline tunneling barrier layer 130' may include MgO having a [100] texture and a large grain size. In one embodiment, the crystalline tunneling barrier 130' includes a layer of MgO having the desired texture and grain size described above. In another embodiment, the crystalline tunneling barrier 130' may include a thin Mg layer adjacent to the insertion layer 120' and a layer of crystalline MgO having the desired texture and grain size. In another embodiment, the crystalline tunneling barrier 130' a layer of crystalline MgO having the desired texture and grain size sandwiched between thin Mg layers adjacent to the insertion layer 120' and the top electrode 140'.

The insertion layer 120' resides between the bottom electrode 110' and the crystalline tunneling barrier 130'. The insertion layer 120 may be magnetic. The insertion layer 120' has a boron affinity. The boron affinity of the insertion layer 120' is greater than the boron affinity of the constituent(s) of the crystalline tunneling barrier layer 130. The insertion layer 120' is analogous to the insertion layer 120. Consequently, the insertion layer 120' may have the same structure as the insertion layer 120. For example, the insertion layer may include Co, Fe, $Co_xFe_{1-x}$, where x is at least zero and not more than one, or a ternary alloy including Co and Fe, such as CoFeTa, or CoFeZr. The insertion layer 120' thus has a higher boron affinity than the Mg in the crystalline tunneling barrier layer 130'. The insertion layer 120' may also be thin. For example, the insertion layer 120' may have a thickness of at least two Angstroms and not more than fifteen Angstroms. In another embodiment, the insertion layer 130' may have a thickness of at least three Angstroms and not more than seven Angstroms.

Because the insertion layer 120' has a higher boron affinity than the constituent, such as Mg, of the crystalline tunneling barrier 130, boron in the bottom electrode 110 may be significantly less likely to diffuse through the insertion layer 120' into the crystalline tunneling barrier 130. Thus, the insertion layer 120' may function as a boron barrier layer between the bottom electrode 110' and the crystalline tunneling barrier layer 130'. The insertion layer 120 may provide a barrier to boron diffusion even at elevated temperature anneals. For example, boron diffusion into the crystalline tunneling barrier 130' may be prevented even at anneals of temperatures of at least one hundred and not more than four hundred degrees centigrade. In one embodiment, the insertion layer 120' may prevent diffusion of boron into the crystalline tunneling barrier 130' at anneals of at least two hundred and not more than three hundred and sixty degrees centigrade. Furthermore, a thin insertion layer 120' may not substantially change the surface roughness of the bottom electrode 110'. Consequently, the crystalline tunneling barrier layer 130' may still be grown on a smooth surface. Thus, the desired orientation and large grain size may be achieved for the crystalline tunneling barrier layer 130'. The insertion layer 120 being magnetic may allow it to be considered part of the bottom electrode 110' for tunneling magnetoresistance. Further, the use of an insertion layer 120' including at least one of Co and Fe provides the desired spin polarization of current carriers at the interface of the crystalline tunneling barrier layer 130' and the bottom electrode 110'. Thus, through the use of the insertion layer 120', the desired Ra and Q for the magnetic structure 100' may be achieved.

Figure 4:
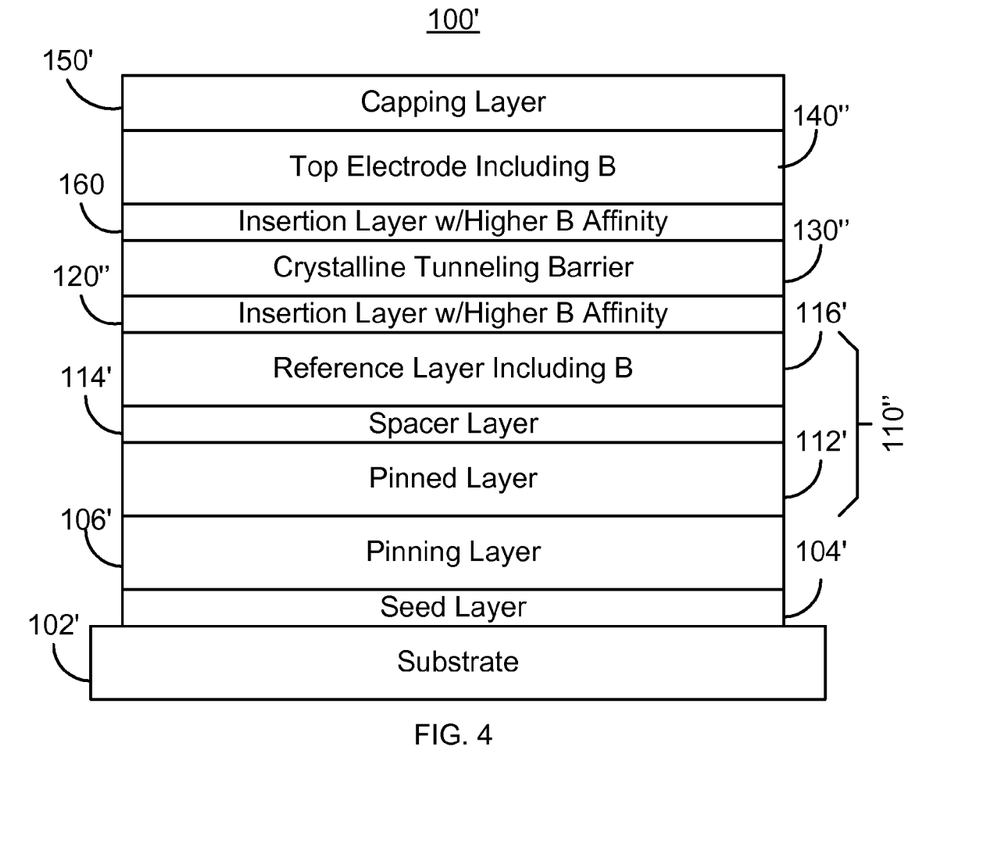
FIG. 4 depicts another exemplary embodiment of a magnetic structure.

FIG. 4 depicts another exemplary embodiment of a magnetic structure 100". For clarity, the magnetic structure 100" is described in the context of a single TMR element. However, in another embodiment, a dual TMR element (not shown) or other analogous structure might be used. For simplicity, FIG. 4 is not drawn to scale. The magnetic structure 100" is analogous to the magnetic structures 100 and 100' depicted in FIGS. 2 and 3, respectively. Consequently, analogous components are labeled similarly. The magnetic structure 100" thus includes a bottom electrode 110", an insertion layer 120", a crystalline tunneling barrier 130", and a top electrode 140". In addition, the magnetic structure 100" includes a pinning layer 106' formed on seed layer(s) 104' as well as a capping layer 150'. The seed layer(s) 104 are formed on a substrate 102'. The components 102', 104', 106', 110", 112', 114', reference layer 116', insertion layer 120", crystalline tunneling barrier 130", top electrode 140', and capping layer 150' have analogous structure and functions to the components 102, 104, 106, 110/110', 112, 114, reference layer 116, insertion layer 120/120", crystalline tunneling barrier 130/130", top electrode 140', and capping layer 150'

The magnetic structure 100" also includes an additional insertion layer 160. The insertion layer 160 resides between the top electrode 140" and the crystalline tunneling barrier 130". The insertion layer 160 may be magnetic and has a boron affinity. The boron affinity of the insertion layer 160 is greater than the boron affinity of the constituent(s) of the crystalline tunneling barrier 130". The insertion layer 160 is analogous to the insertion layer 120/120'/120". Consequently, the insertion layer 160 may have the same structure as the insertion layer 120/120'/120". For example, the insertion layer may include Co, Fe, $Co_xFe_{1-x}$, where x is at least zero and not more than one, or a ternary alloy including Co and Fe, such as CoFeTa, or CoFeZr. The insertion layer 160 thus has a higher boron affinity than the Mg in the crystalline tunneling barrier layer 130". The insertion layer 160 may also be thin. For example, the insertion layer 160 may have a thickness of at least two Angstroms and not more than fifteen Angstroms. In another embodiment, the insertion layer 130' may have a thickness of at least three Angstroms and not more than seven Angstroms.

The magnetic structure 100" has analogous benefits to the magnetic structures 100/100'. Because of the presence of the insertion layer 120" having a higher boron affinity than the constituent, such as Mg, of the crystalline tunneling barrier 130", boron in the bottom electrode 110" is significantly less likely to diffuse through the insertion layer 120" into the crystalline tunneling barrier 130". Furthermore, a thin insertion layer 120" may not substantially change the surface roughness of the bottom electrode 110". The use of an insertion layer 120" including at least one of Co and Fe provides the desired spin polarization of current carriers at the interface of the crystalline tunneling barrier layer 130" and the bottom electrode 110'. Thus, through the use of the insertion layer 120", the desired Ra and Q for the magnetic structure 100' may be achieved.

In addition, because the insertion layer 160 has a higher boron affinity, diffusion of boron to the crystalline tunneling barrier layer 130" from the top electrode 140" may be reduced or eliminated. Consequently, impurities in the crystalline tunneling barrier 130" may be reduced or eliminated. The crystalline tunneling barrier 130" and the magnetic structure 100" may thus have the desired properties. Use of the insertion layer 160 that is magnetic may allow the insertion layer 140 to be considered part of the top electrode 140". The use of an insertion layer 160 including at least one of Co and Fe provides the desired spin polarization of current carriers at the interface of the crystalline tunneling barrier layer 130" and the top electrode 140". Consequently, performance and reliability of the magnetic structure 100" may be improved.

Figure 5:
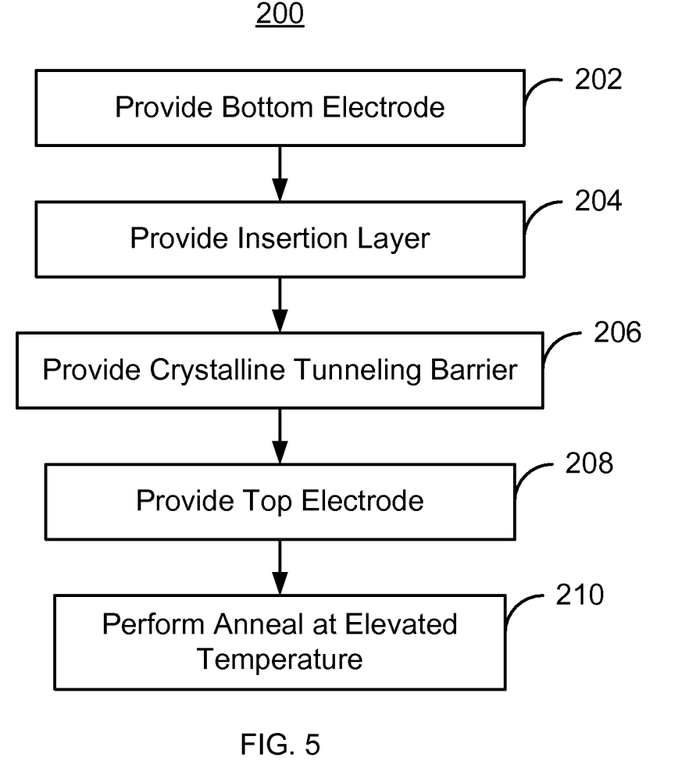
FIG. 5 is a flow chart depicting an exemplary embodiment of a method for providing a magnetic structure.

FIG. 5 is a flow chart depicting an exemplary embodiment of a method 200 for providing a magnetic structure. For clarity, steps in the method 200 may be omitted or combined. The method 200 is described in the context of the magnetic structure 100. However, the method 200 may be used in providing other magnetic structure.

A bottom, or first, electrode 110 is provided, via step 202. Step 202 includes providing at least a first magnetic material and boron. In one embodiment, the seed and pinning layers (not shown in FIG. 2) may also be provided.

The insertion layer 120 is provided on the bottom electrode 110, via step 204. The insertion layer 120 has a particular first boron affinity. For example, step 204 may include sputter depositing a thin layer of $Co_xFe_{1-x}$, where x is at least zero and not more than one or other analogous material. Because the insertion layer 120 may be magnetic, it may be considered part of the bottom electrode 110.

A crystalline tunneling barrier layer 130 is provided on the insertion layer 120, via step 206. In one embodiment, step 206 may include providing a layer of MgO such that the desired texture and grain size are achieved. In another embodiment, step 206 includes providing a thin Mg layer adjacent to the insertion layer 120 and a layer of crystalline MgO having the desired texture and grain size (e.g. Mg/MgO). In another embodiment, step 206 may include providing the crystalline tunneling barrier 130 may include providing a layer of crystalline MgO having the desired texture and grain size sandwiched between thin Mg layers adjacent to the insertion layer 120 and the top electrode 140 (e.g. Mg/MgO/Mg). Constituents of the crystalline tunneling barrier 130 provided in step 206 has a lower boron affinity than the insertion layer 120 provided in step 204. A top, or second, electrode 140 is provided on the crystalline tunneling barrier layer 130, via step 208.

An anneal is performed at a temperature of at least one hundred degrees Celsius, via step 210. In one embodiment, the anneal performed in step 210 is at a temperature of not more than four hundred degrees centigrade. In another embodiment, the anneal performed in step 210 is at a temperature of at least two hundred degrees centigrade and not more than three hundred and sixty degrees centigrade. Processing may then be completed.

Using the method 200, a magnetic structure 100/100'/100" may be provided. The magnetic structure 100/100'/100" provided may undergo an anneal at elevated temperature without poisoning the crystalline tunneling barrier layer 130/130'/130". Thus, the method 200 may provide a magnetic element having improved performance.

Figure 6:
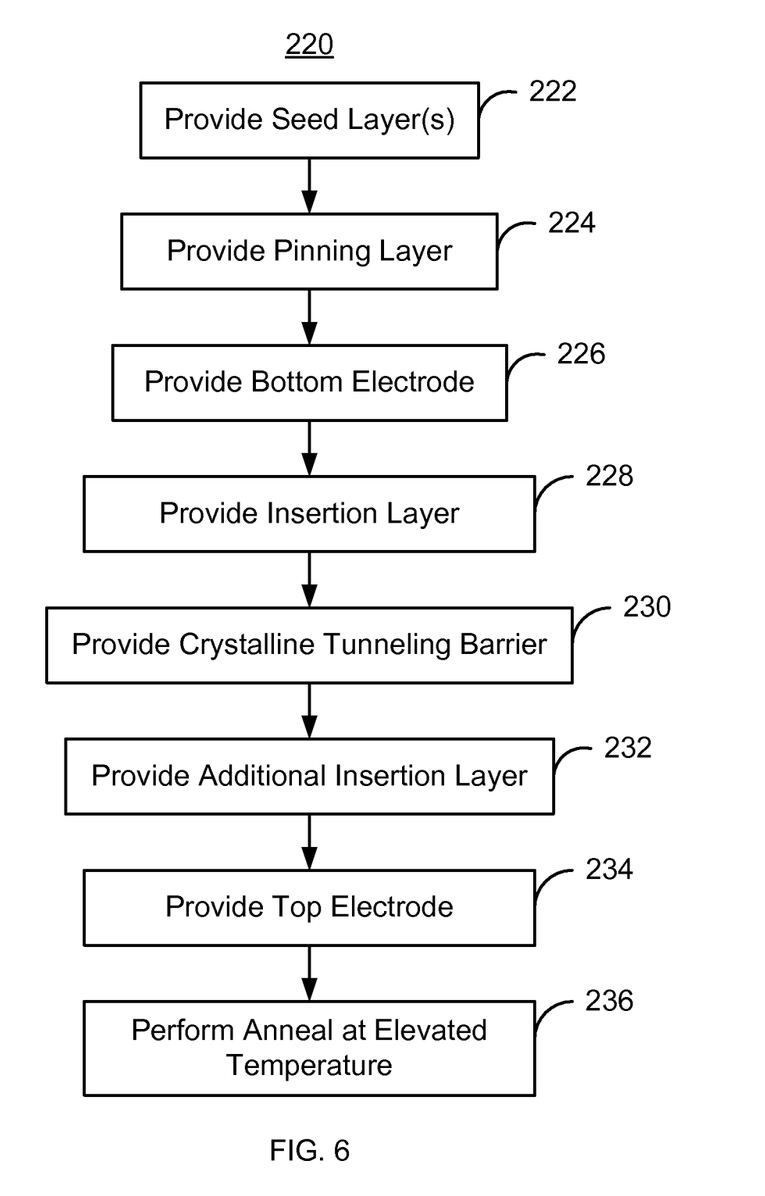
FIG. 6 is a flow chart depicting another exemplary embodiment of a method for providing a magnetic structure.

FIG. 6 is a flow chart depicting another exemplary embodiment of a method 220 for providing a magnetic structure. For clarity, steps in the method 220 may be omitted or combined. The method 220 is described in the context of the magnetic structure 100". However, the method 220 may be used in providing other magnetic structure.

The seed layer(s) 104' and pinning layer 106' are provided, via steps 222 and 224, respectively. A bottom, or first, electrode 110' including boron is provided, via step 226. Step 226 includes providing at least a first magnetic material and boron. In one embodiment, step 226 includes providing the pinned layer 112', the spacer layer 114', and the reference layer 116'. For example, a trilayer of CoFe/Ru/CoFeB or four layers including CoFe/Ru/CoFe/Ta/CoFeB may be provided in step 226.

The insertion layer 120" is provided on the bottom electrode 110", via step 228. For example, step 228 may include sputter depositing a thin layer of $Co_xFe_{1-x}$ where x is at least zero and not more than one, a thin layer of CoFeTa, or a thin layer of CoFeZr. Other analogous materials might also be used.

A crystalline tunneling barrier layer 130" is provided on the insertion layer 120", via step 230. In one embodiment, step 206 may include depositing a layer of MgO such that the desired texture and grain size are achieved. In another embodiment, step 230 may include providing a crystalline tunneling barrier 130" of Mg/MgO or Mg/MgO/Mg. An additional insertion layer 260 may optionally be provided, via step 232. Step 232 is analogous to step 228. For example, step 232 may include sputter depositing a thin layer of $Co_xFe_{1-x}$, where x is at least zero and not more than one, a thin layer of CoFeTa, or a thin layer of CoFeZr. Other analogous materials might also be used. A second, or top, electrode 140" is provided, via step 234.

An anneal is performed at a temperature of at least one hundred degrees Celsius, via step 236. In one embodiment, the anneal performed in step 236 is at a temperature of not more than four hundred degrees centigrade. In another embodiment, the anneal performed in step 236 is at a temperature of at least two hundred degrees centigrade and not more than three hundred and sixty degrees centigrade. In one embodiment, the anneal may be performed in an applied magnetic field. For example, a field of at least 0.5 and not more than 5.0 Tesla might be used. Processing of the device including the magnetic structure 100" may then be completed.

Using the method 220, a magnetic structure 100/100'/100" may be provided. The magnetic structure 100/100'/100" may undergo an anneal at elevated temperature without introducing B into the crystalline tunneling barrier layer 130/130'/130". Thus, the method 220 may provide a magnetic element having improved performance.

We claim:

1. A magnetoresistive structure comprising:
a first electrode, the first electrode including at least a first magnetic material and boron, the first electrode having a first surface having a first surface roughness;
an insertion layer having a first boron affinity, adjoining the first surface of the first electrode and having a second surface opposite to the first electrode, the insertion layer having a thickness of at least two Angstroms and not more than fifteen Angstroms, the insertion layer being a ternary alloy selected from the group consisting of CoFeTa and CoFeZr;
a crystalline tunneling barrier layer including at least one constituent, the insertion layer residing between the crystalline tunneling barrier layer and the first electrode, the at least one constituent having at least a second boron affinity, the at least the second boron affinity being less than the first boron affinity; and a second electrode, the second electrode including at least a second magnetic material;

the insertion layer configured to prevent diffusion of boron from the first electrode to the crystalline tunneling barrier layer at an anneal having a temperature of at least one hundred degrees centigrade and such that the second surface of the insertion layer has a second surface roughness substantially equal to the first surface roughness, the second surface having the second surface roughness forming a growth surface for the crystalline tunneling barrier layer.

2. The magnetoresistive structure of claim 1 wherein the thickness is at least three Angstroms and not more than seven Angstroms.

3. The magnetoresistive structure of claim 1 wherein the insertion layer is magnetic.

4. The magnetoresistive structure of claim 1 wherein the first electrode is a bottom electrode and the second electrode is a top electrode.

5. The magnetoresistive structure of claim 4 wherein the first electrode includes a pinned layer and the second electrode includes a free layer.

6. The magnetoresistive structure of claim 5 wherein the pinned layer is a synthetic antiferromagnet including a first magnetic layer, a second magnetic layer, and nonmagnetic layer between the first magnetic layer and the second magnetic layer.

7. The magnetoresistive structure of claim 4 wherein the first electrode includes a free layer and the second electrode includes a pinned layer.

8. The magnetoresistive structure of claim 1 wherein the crystalline tunneling barrier includes a crystalline MgO layer.

9. The magnetoresistive structure of claim 1 wherein the insertion layer is configured to prevent diffusion of the boron from the first electrode into the crystalline tunneling barrier at the anneal having the temperature of at least two hundred degrees centigrade.

10. The magnetoresistive structure of claim 1 wherein the insertion layer is configured to prevent diffusion of the boron from the first electrode into the crystalline tunneling barrier at the anneal having the temperature of no more than four hundred degrees centigrade.

11. The magnetoresistive structure of claim 10 wherein the insertion layer is configured to prevent diffusion of the boron from the first electrode into the crystalline tunneling barrier at the anneal having the temperature of no more than three hundred sixty degrees centigrade.

12. The magnetoresistive layer of claim 1 further comprising:

an additional insertion layer residing between the crystalline tunneling barrier and the second electrode, the additional insertion layer having a third boron affinity greater than the at least the second boron affinity.

13. A magnetoresistive structure comprising:

a first electrode, the first electrode including at least a first magnetic material and boron, the first electrode having a first surface having a first surface roughness;

an insertion layer consisting of at least one of CoFeTa and CoFeZr and having a thickness of at least two Angstroms and not more than fifteen Angstroms, the insertion layer adjoining the first surface of the first electrode and having a second surface opposite to the first electrode;

a crystalline tunneling barrier layer including MgO, the insertion layer residing between the crystalline tunneling barrier layer and the first electrode; and a second electrode, the second electrode including at least a second magnetic material;

wherein the insertion layer configured to prevent diffusion of boron from the first electrode to the crystalline tunneling barrier layer at an anneal having a temperature of at least one hundred degrees centigrade and such that the second surface of the insertion layer has a second surface roughness substantially the same as the first surface roughness, the second surface having the second surface roughness forming a growth surface for the crystalline tunneling barrier layer.

14. The magnetoresistive structure of claim 13 further comprising:

an additional insertion layer residing between the crystalline tunneling barrier and the second electrode, the additional insertion including $Co_yFe_{1-y}$ and having a thickness of at least two Angstroms and not more than fifteen Angstroms, where y is at least zero and not more than one.

15. A method for providing magnetoresistive structure comprising:

providing a first electrode, the first electrode including at least a first magnetic material and boron, the first electrode having a first surface having a first surface roughness;

providing an insertion layer having a first boron affinity on the first electrode, the insertion layer adjoining the first surface of the electrode and having a second surface opposite to the first electrode, the insertion layer having a thickness of at least two Angstroms and not more than fifteen Angstroms, the insertion layer being a ternary alloy selected from the group consisting of CoFeTa and CoFeZr;

providing a crystalline tunneling barrier layer on the insertion layer, the crystalline tunneling barrier layer including at least one constituent, the at least one constituent having at least a second boron affinity, the at least the second boron affinity being less than the first boron affinity;

providing a second electrode on the crystalline tunneling barrier layer, the second electrode including at least a second magnetic material; and performing an anneal at a temperature of at least one hundred degrees centigrade;

the insertion layer configured to prevent diffusion of boron from the first electrode to the crystalline tunneling barrier layer at the anneal and such that the second surface of the insertion layer has a second surface roughness substantially equal to the first surface roughness, the second surface having the second surface roughness forming a growth surface for the crystalline tunneling barrier layer.

16. The method of claim 15 wherein the thickness is at least three Angstroms and not more than seven Angstroms.

17. The method of claim 15 wherein the insertion layer is magnetic.

18. The method of claim 15 wherein providing the crystalline tunneling barrier further includes providing a crystalline MgO layer.

19. The method of claim 15 further comprising:

providing an additional insertion layer on the crystalline tunneling barrier before the second electrode is provided, the additional boron insertion having a third boron affinity greater than the at least the second boron affinity.

20. The method of claim 15 wherein the temperature of the anneal is at least two hundred degrees centigrade.

21. The method of claim 15 wherein the temperature of the anneal is not more than four hundred degrees centigrade.

22. The method of claim 21 wherein the temperature of the anneal is not more than three hundred sixty degrees centigrade.

23. A method for providing magnetoresistive structure comprising:
providing a first electrode including CoFeB, the first electrode having a first surface having a first surface roughness;
providing an insertion layer consisting of at least one of CoFeTa and CoFeZr and having a thickness of at least three Angstroms and not more than seven Angstroms, the insertion layer adjoining the first surface of the first electrode and having a second surface opposite to the first electrode;
providing a crystalline tunneling barrier layer including MgO, the insertion layer residing between the crystalline tunneling barrier layer and the first electrode; and
providing a second electrode, the second electrode including at least a second magnetic material;
performing an anneal at a temperature of at least two hundred degrees centigrade and not more than three hundred sixty degrees centigrade;
wherein the insertion layer configured to prevent diffusion of boron from the first electrode to the crystalline tunneling barrier layer at an anneal having a temperature of at least one hundred degrees centigrade and such that the second surface of the insertion layer has a second surface roughness substantially the same as the first surface roughness, the second surface having the second surface roughness forming a growth surface for the crystalline tunneling barrier layer.

24. The method of claim 21 further comprising:
providing an additional insertion layer on the crystalline tunneling barrier and before providing the second electrode, the additional insertion including $Co_yFe_{1-y}$ and having a thickness of at least three Angstroms and not more than seventeen Angstroms, where y is at least zero and not more than one.

* * * * *